(12) United States Patent
Yang et al.

(10) Patent No.: US 11,397,460 B2
(45) Date of Patent: Jul. 26, 2022

(54) INTELLIGENT POWER SAVING MODE FOR SOLID STATE DRIVE (SSD) SYSTEMS

(71) Applicant: Western Digital Technologies, Inc., San Jose, CA (US)

(72) Inventors: Nian Niles Yang, Mountain View, CA (US); Dmitry Vaysman, San Jose, CA (US); Ekram Bhuiyan, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 511 days.

(21) Appl. No.: 16/446,927

(22) Filed: Jun. 20, 2019

(65) Prior Publication Data

US 2020/0401207 A1    Dec. 24, 2020

(51) Int. Cl.
| | | |
|---|---|---|
| *G06F 1/3234* | (2019.01) | |
| *G11C 16/30* | (2006.01) | |
| *G11C 16/26* | (2006.01) | |
| *G11C 16/04* | (2006.01) | |

(52) U.S. Cl.
CPC ............ *G06F 1/3275* (2013.01); *G11C 16/26* (2013.01); *G11C 16/30* (2013.01); *G11C 16/0483* (2013.01)

(58) Field of Classification Search
CPC ....... G06F 1/3275; G11C 16/26; G11C 16/30; G11C 16/0483
See application file for complete search history.

(56) References Cited

U.S. PATENT DOCUMENTS

| | | | |
|---|---|---|---|
| 7,549,066 B2 | 6/2009 | Haid et al. | |
| 8,547,769 B2 * | 10/2013 | Saraswat | G06F 1/3275 365/226 |
| 9,558,848 B2 | 1/2017 | Caulfield et al. | |
| 9,746,383 B2 * | 8/2017 | Hsu | G11C 7/04 |
| 9,965,208 B1 * | 5/2018 | Roohparvar | G06F 3/0626 |
| 9,977,487 B2 | 5/2018 | Choi et al. | |
| 2005/0105367 A1 * | 5/2005 | Kim | G11C 11/40615 365/226 |
| 2007/0079152 A1 * | 4/2007 | Winick | G06F 1/206 713/300 |
| 2012/0200336 A1 * | 8/2012 | Ramaraju | H03K 19/0008 327/512 |
| 2014/0032956 A1 * | 1/2014 | De Caro | G06F 1/3296 713/324 |
| 2015/0143026 A1 * | 5/2015 | Reddy | G06F 3/0679 711/103 |

(Continued)

*Primary Examiner* — Aurel Prifti
(74) *Attorney, Agent, or Firm* — Vierra Magen Marcus LLP

(57) ABSTRACT

For solid state drive (SSD) or other memory system formed of multiple memory dies, techniques are presented for operation in a standby mode with increased power savings. The memory dies are operable in a regular standby mode and in a low power standby mode. Based upon the amount of current each of the memory dies in the regular standby mode, when the device goes into standby the memory dies that draw higher amounts of current when in the regular standby mode are instead placed into the low power standby mode. The amount of current drawn by each of the memory die in the regular standby mode can be determined for each of the memory dies at die sort or as part of the memory test process, or can be determine by an assembled SSD itself.

20 Claims, 13 Drawing Sheets

(56) References Cited

U.S. PATENT DOCUMENTS

| | | | |
|---|---|---|---|
| 2016/0162219 A1* | 6/2016 | Erez | G11C 8/12 |
| | | | 711/103 |
| 2016/0378149 A1* | 12/2016 | Kam | G06F 1/3206 |
| | | | 713/320 |
| 2017/0052551 A1* | 2/2017 | Bang | G05B 15/02 |
| 2017/0060443 A1* | 3/2017 | Roh | G06F 3/0613 |
| 2017/0084344 A1* | 3/2017 | Choi | G11C 5/14 |
| 2017/0124007 A1* | 5/2017 | Zehavi | G06F 13/4068 |
| 2018/0046231 A1* | 2/2018 | Raghu | G06F 3/0616 |
| 2019/0018474 A1* | 1/2019 | Bacchus | G06F 1/3206 |
| 2019/0050147 A1* | 2/2019 | Koo | G06F 3/061 |
| 2019/0050153 A1* | 2/2019 | Yang | G06F 1/206 |
| 2019/0265888 A1* | 8/2019 | Yang | G11C 11/5671 |
| 2019/0286219 A1* | 9/2019 | Anazawa | G06F 3/068 |
| 2019/0339755 A1* | 11/2019 | Chai | G06F 1/263 |
| 2020/0075061 A1* | 3/2020 | Rowley | G06F 1/3296 |

* cited by examiner

INTELLIGENT POWER SAVING MODE FOR SOLID STATE DRIVE (SSD) SYSTEMS

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

A solid state drive (SSD) is a solid-state storage device that uses non-volatile integrated circuit memory assemblies as memory to store large amounts of data persistently. Relative to other high capacity storage, an advantage of SSDs is their low power usage. Consequently, the utility of SSDs can be further increased by introducing further power savings for such devices.

BRIEF DESCRIPTION OF THE DRAWINGS

Like-numbered elements refer to common components in the different figures.

DETAILED DESCRIPTION

Power saving is an important characteristic of solid state drives and is an important advantage of SSDs over hard disk drives (HDDs). This is especially true for client and mobile applications where the standby power, when the memory device is not in actual use, should to as low as practical. SDDs and other non-volatile memory systems typically include a number of individual memory circuits. Due to the variations in the standby current (Iccs) between the different integrated memory circuits, the dies used within the SSD may draw different amount of Iccs. The Iccs of each die used in the SSD when the SSD is built is not usually known, though generally the package level leakage current needs to be lower than a threshold, which determined by the memory test. This situation can be improved if the SSD were to know the Iccs values of each die in a real application, and thus selectively adjust the dies' Iccs to achieve optimum standby mode power savings, while not introducing long latency. However, this would involve the SSD knowing the Iccs amount from each die and how to further improve the SSD standby power reduction at the NAND die level.

The following presents approaches on how to handle this SSD design issue for real time adjusted, machine learning based power saving. The technique uses knowledge of the standby current, or Iccs, for each of the drive's memory dies, where these values can be determined for each of the memory dies at the die sort or memory test level and stored in the memory die's ROM where it can be accessed by the control circuits of the drive. Alternately, the memory drive itself can determine an Iccs value for each of the memory die by setting the memory dies into a lower power, deep standby mode and measure the combined current drawn the memory dies. While keeping all of the other memory dies in the low power deep, standby mode, the memory dies are set into the regular standby one at a time to determine the relative increase in the cumulative Iccs of the drive that can be attributed to the particular die being in the regular standby mode.

Figure 1:
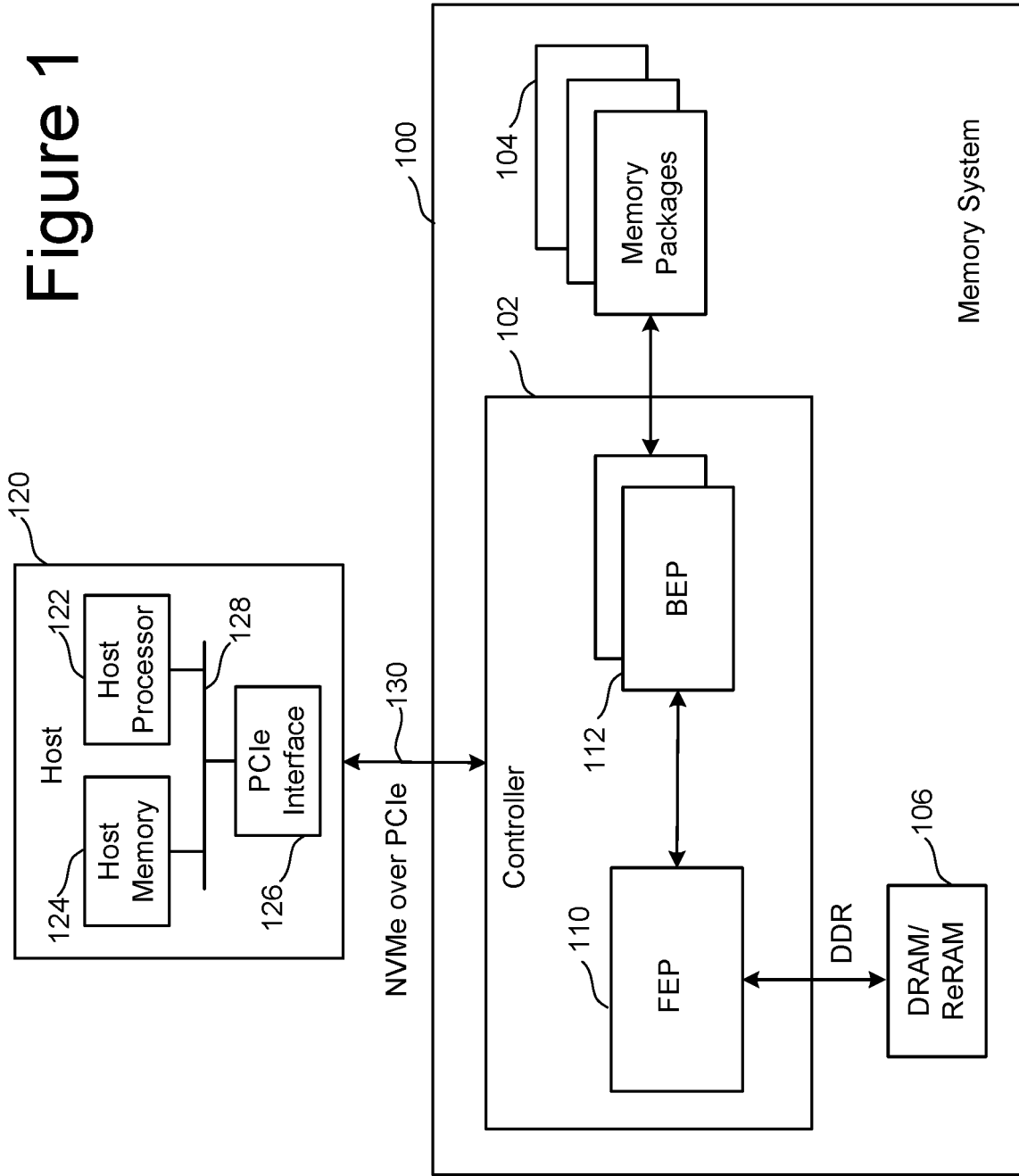
FIG. 1 is a block diagram of one embodiment of a memory system connected to a host.

With the Iccs values of its constituent memory dies known, in the power standby mode of the SSD the controller of the drive can issue a low power, deep standby mode command the memory dies that have relatively high Iccs values when in the normal standby mode, while the other memory dies with lower Iccs values can be set in the normal standby mode. This determination can be a function of temperature. When the drive comes out of the standby mode, only selected NAND dies can come out of deep standby mode, instead of taking all the memory dies out of deep standby, further adding to power savings FIG. 1 is a block diagram of one embodiment of a memory system 100 connected to a host 120. Memory system 100 can implement the technology proposed herein for an intelligent power saving mode. The memory system 100 includes a controller 102 that encodes data streams with a corresponding level of ECC, forms the streams into ECC codewords, forms the codewords into pages, and transfers the pages to memory packages 104 to be written into memory. Many different types of memory systems can be used with the technology proposed herein. Example memory systems include solid state drives ("SSDs"), memory cards and embedded memory devices; however, other types of memory systems can also be used.

Memory system 100 of FIG. 1 comprises the controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. In one embodiment, the ASICs for each of the BEP circuit(s) 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host 120, management of DRAM (local volatile memory), and management of the overall operation of the SSD (or other non-volatile storage system). The BEP circuit(s) 112 manages memory operations in the memory packages/die at the request of FEP circuit 110. For example, the BEP circuit(s) 112 can carry out the read, erase, and programming processes. Additionally, the BEP circuit(s) 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory of memory packages 104 comprises a plurality of memory packages. Each memory package includes one or more memory die. Therefore, Controller 102 is connected to one or more non-volatile memory die. In one embodiment, each memory die in the memory packages 104 utilize NAND flash memory (e.g., two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. In one embodiment, host 120 is external to and separate from memory system 100. In another embodiment, memory system 100 is embedded in host 120.

Figure 2:
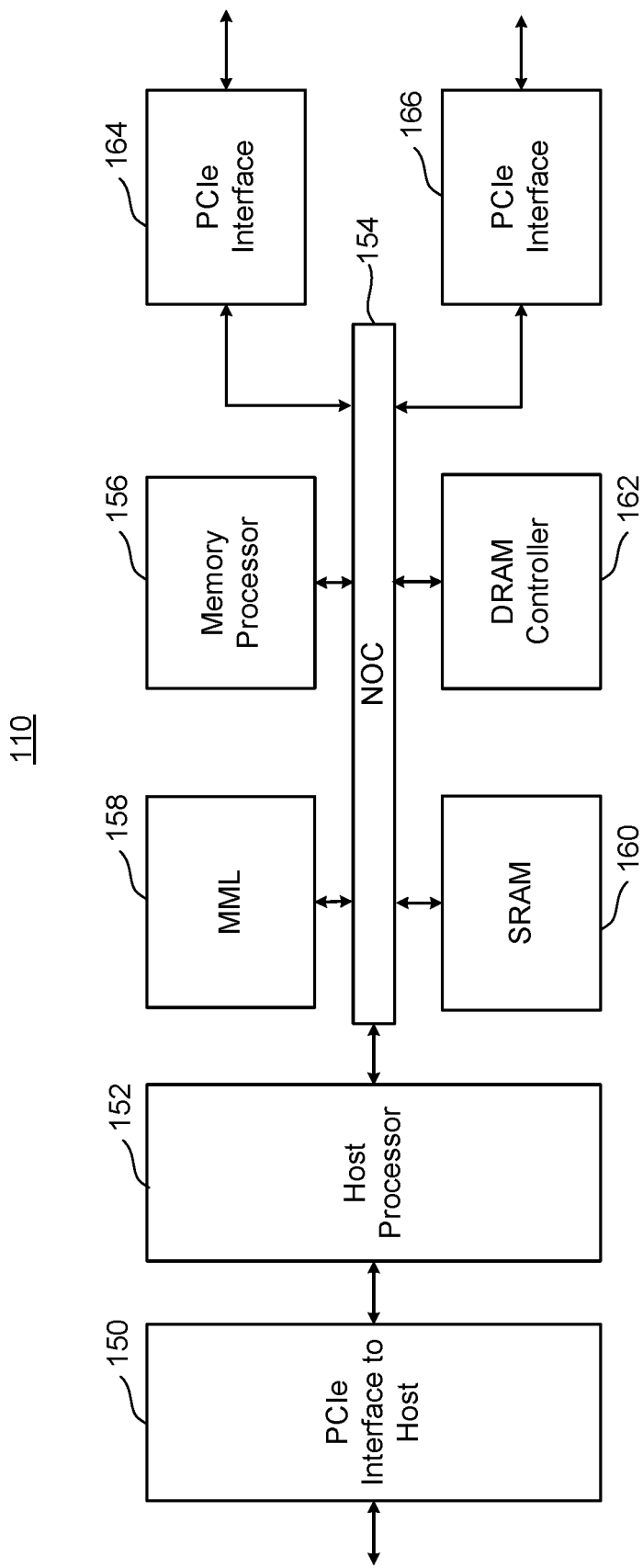
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface 150. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC 154 are shared by many signals. A high level of parallelism is achieved because all links in the NOC 154 can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is a memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC 154 are two PCIe Interfaces 164 and 166. In the embodiment of FIG. 2, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML 158 may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate writes from the host into writes into the memory structure.

Figure 3:
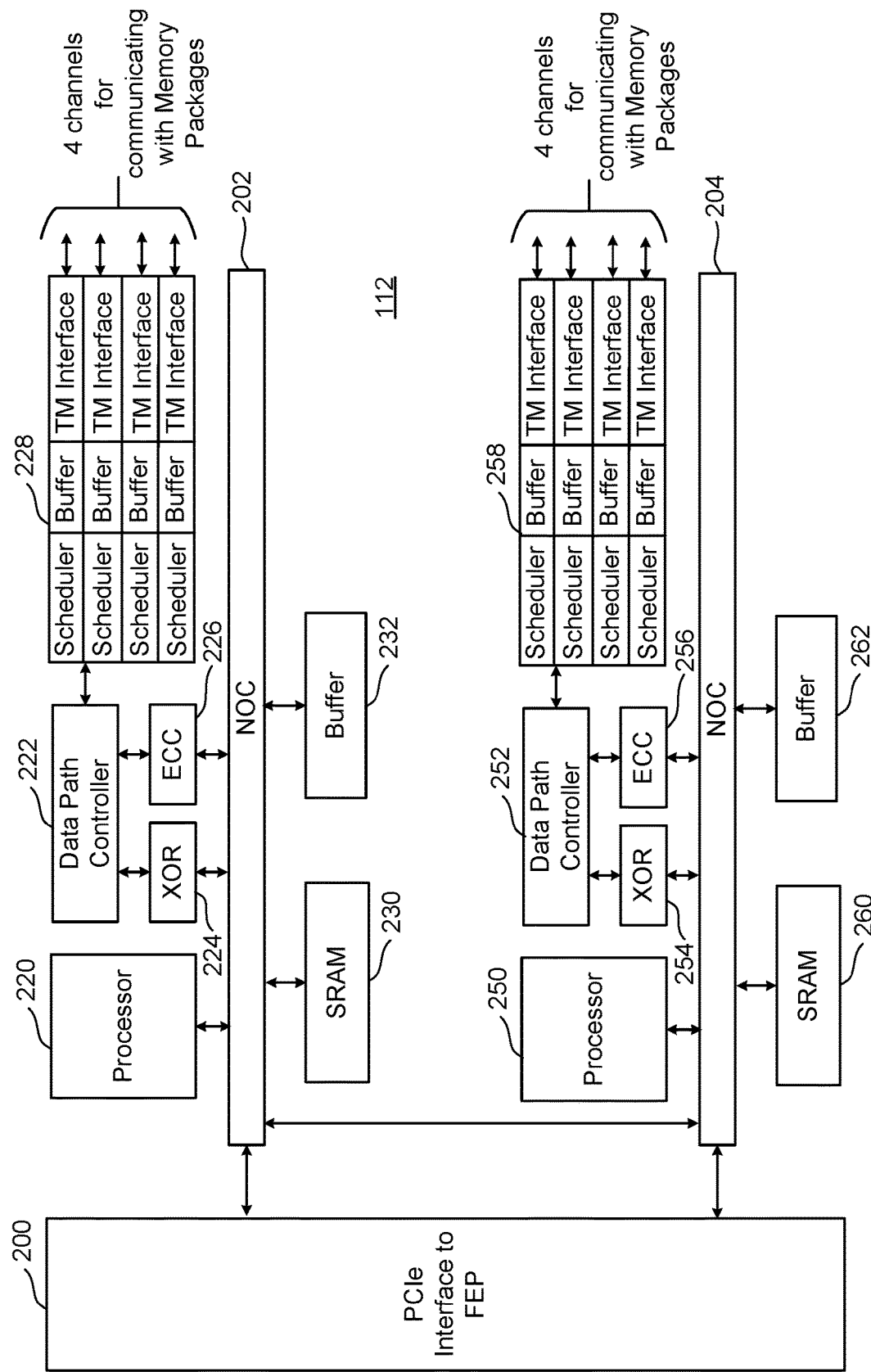
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), a processor (220/250), and a data path controller (222/252) via an XOR engine (224/254) and an ECC engine (226/256). The ECC engines 226/256 are used to perform error correction, as known in the art. SRAM 230/260 is local RAM memory used by memory processor 220/250. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. In certain embodiments, the XOR engines 224/254 and ECC engines 226/256 are dedicated hardware circuits, known as hardware accelerators. In other embodiments, the XOR engines 224/254 and ECC engines 226/256 can be implemented in software. Embodiments of the ECC engines 224/254 are discussed further below, with respect to the use of "vertical ECC". The scheduler, buffer, and TM Interfaces are hardware circuits.

Figure 4:
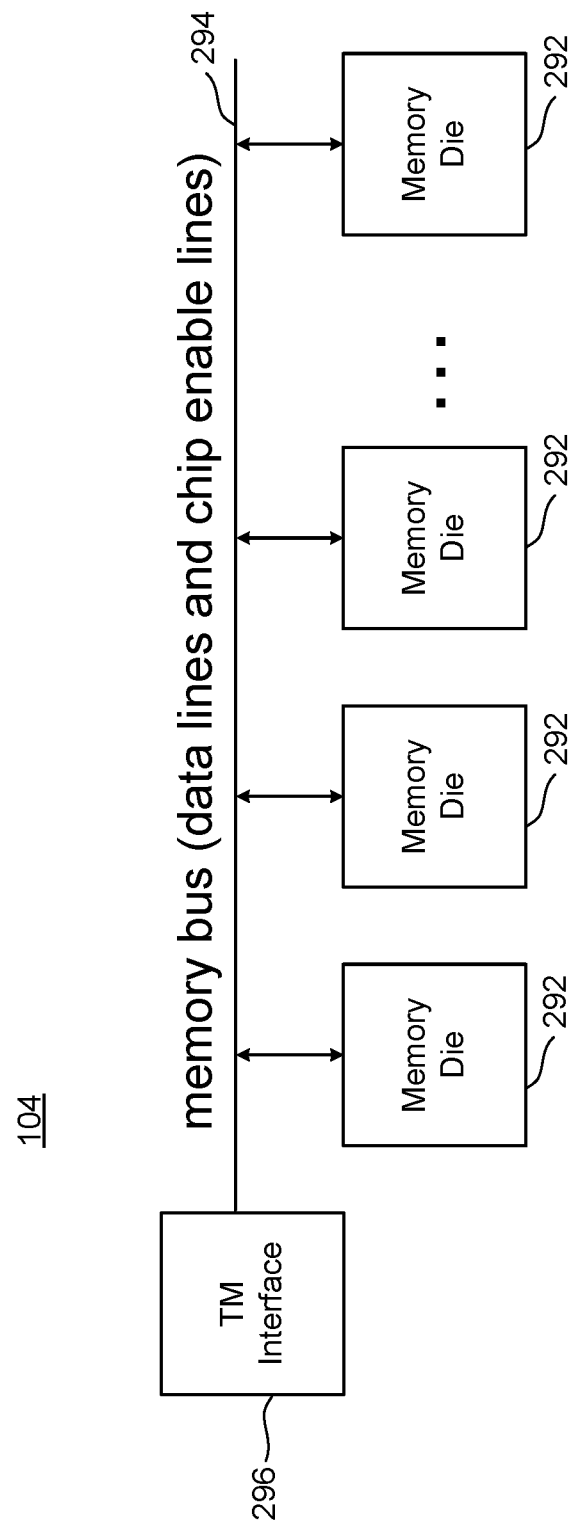
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package 104 can include a small controller connected to the memory bus and the TM Interface. The memory package 104 can have one or more memory die 292. In one embodiment, each memory package 104 includes eight or 16 memory die; however, other numbers of memory die can also be implemented. The technology described herein is not limited to any particular number of memory die.

Figure 5:
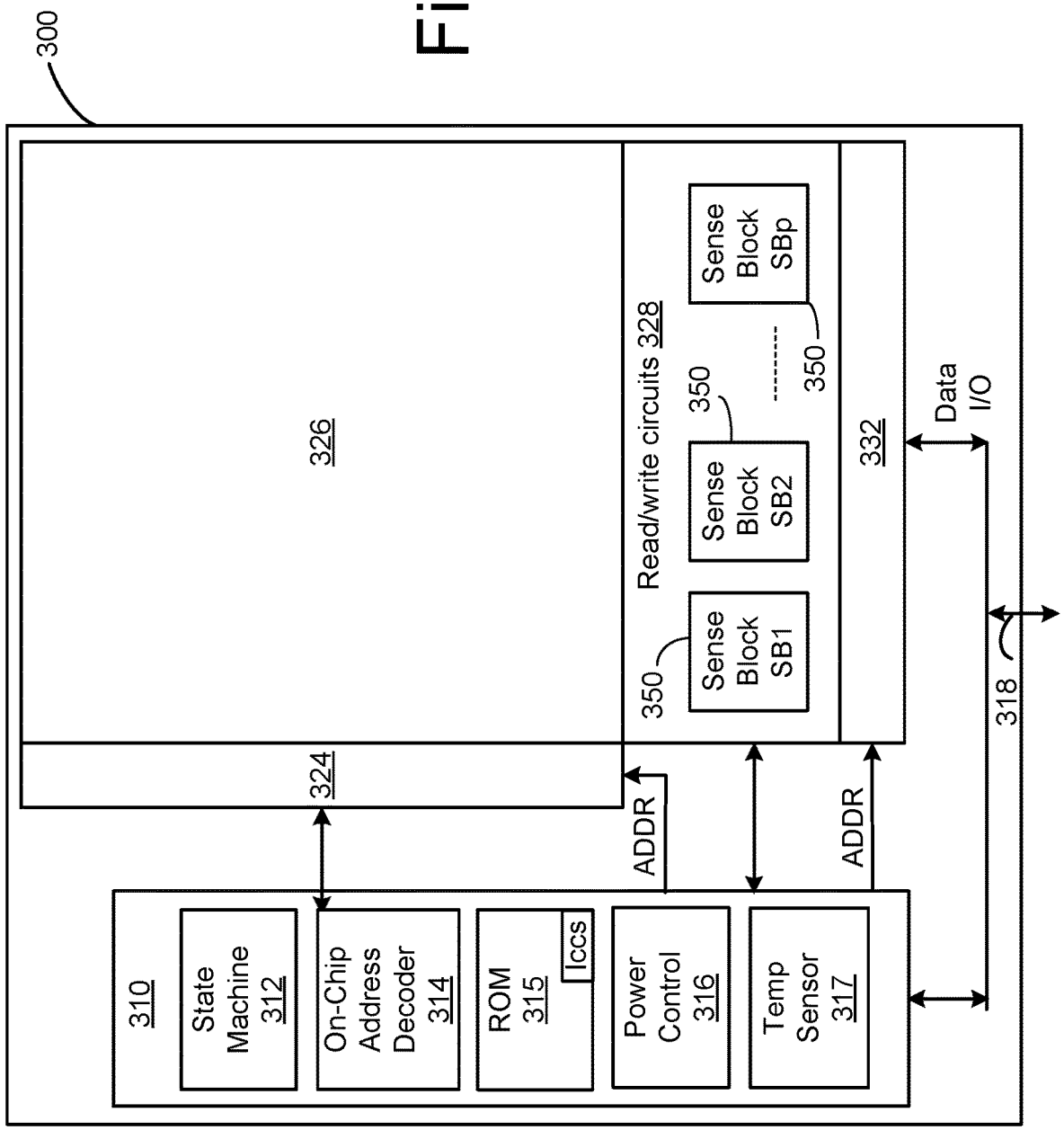
FIG. 5 is a block diagram of one embodiment of a memory die.

FIG. 5 is a functional block diagram of one embodiment of a memory die 300 (e.g., the memory die 292 in FIG. 4). The components depicted in FIG. 5 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the Controller 102 (in FIG. 1) and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, a power control circuit 316, and a temperature sensor circuit 317. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM 315 and other storage devices for storing default values such as base voltages and other parameters. Among the values that can be stored in a memory die's ROM in some embodiments is the standby current value (Iccs) of the memory die, as discussed in more detail below. Temperature sensor circuit 317 detects current temperature at memory die 300.

The on-chip address decoder 314 provides an address interface between addresses used by the Controller 102 to the hardware address used by the decoders 324 and 332.

Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" refers to a controller (e.g., 102), a state machine (e.g., 312), a micro-controller and/or control circuitry (e.g., 310), or other analogous circuits that are used to control non-volatile memory.

In one embodiment, memory structure 326 comprises a three dimensional memory array of non-volatile memory cells in which multiple memory levels are formed above a single substrate, such as a wafer. The memory structure 326 may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 326 include two dimensional arrays, three dimensional arrays, cross-point arrays, stacked two dimensional arrays, vertical bit line arrays, and the like.

One example of a ReRAM, or PCM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store data. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

An important factor in the design of an SSD or other memory system 100 is power consumption. Power saving is an important characteristic of SSDs and is one of their advantages over hard disk drives. This is especially true for the client and mobile applications where the standby power needs to be as low as practical. An SSD is formed of a number of individual memory dies, such as NAND flash memory dies. Due to the flash memory standby current (Iccs) variations, the NAND dies used within an SSD may display different amount of Iccs. The Iccs of each die used in the SSD when the SSD is built is not usually well known, though generally the package level leakage current needs to be lower than certain threshold, as can determined by the memory test.

If the SSD were to know the Iccs amount drawn by each component die in a real application, then it could selectively adjust the individual dies' Iccs to optimize power savings when in a standby mode, while not introducing long latencies. Previously, SSDs have not known the Iccs values of the individual memory dies in real applications and, consequently, have not known how to improve the SSD standby power use at the memory die level. The following presents techniques for handling this SSD design issue for a real time adjusted, machine learning based power saving. SSDs have previously not used any particular countermeasure for the standby power reduction or, if they do, they may do this by reducing the voltage (Vcc) from the power supply to all of the memory dies in a standby mode; however, there has not been a machine learning based power saving mode as presented here.

Although the following discussion is presented mainly in the context of solid state drives having a number of memory dies of the NAND flash memory type, the individual memory die can also be based on other non-volatile memory technologies described above, such as MRAM or phase change memory (PCM). The techniques can also be applied to other memory systems, such as DRAM, for example. More generally, these techniques can be applied in systems having a number of separate integrated circuits that are commonly supplied by a power source and that draw levels of current in a standby mode that vary between these integrated circuits.

Figure 6:
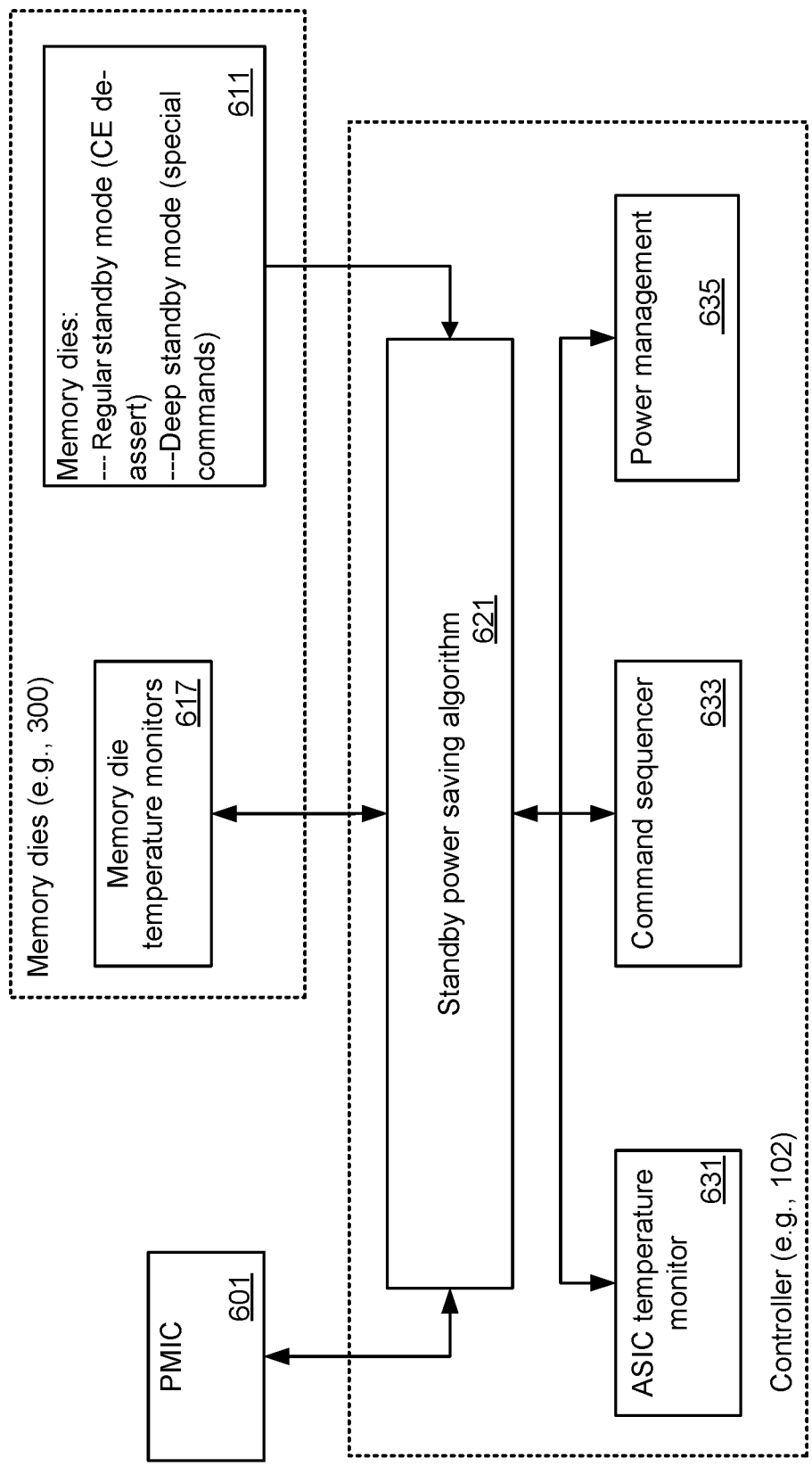
FIG. 6 illustrates some of the main elements of an embodiment for SSD power behavior when the memory dies, controller elements, and firmware in a standby power saving algorithm.

FIG. 6 illustrates some of the main elements of an embodiment for SSD improving power behavior, showing the memory dies, controller elements, and firmware involved in a standby power saving algorithm. The schematic representation of FIG. 6 includes a power module integrated circuit (PMIC) 601 that supplies power to the other elements of the SSD. Although presented here as a separate integrated circuit of the SSD, in other embodiments this can be a module on a controller ASIC. As described in more detail in the following, the PMIC 601 can have a die by die mapping of the standby current Iccs monitoring.

The SSD or other memory system also includes the multiple memory dies 611, such those illustrated at FIG. 5. Each of the die can be operated in a regular standby mode, such as when the corresponding chip enable (CE) is de-asserted. Each of the memory die also has a deep standby mode, which can be enabled by a special command for this purpose. In a regular standby mode, when its CE is de-asserted, a memory die will be ready to respond when its corresponding CE is re-asserted. A memory die will also often be able to perform various background operations, including housekeeping operations such as background erase operations or garbage collection, when its CE is de-asserted. In a deep standby, the memory die only maintains those functions needed to recover in case of a wakeup command. In deep standby, there would be no background operations or power cycling and most circuit elements on the die will be shut down, except for some elements of the control circuit 310 needed to respond to a command to bring the die out of deep standby and become ready to execute commands.

Embodiments of the memory die can also include a temperature monitor 617 (corresponding to temperature sensor 317 of FIG. 5) to monitor the temperature on the integrated circuit. The standby current Iccs typically depends upon the device's temperature, generally increasing as the device's temperature increases. As discussed in the flows presented below, in some embodiments the temperature variations of the different memory die can be used to determine which memory dies, and how many memory dies, to set into deep standby.

The elements on the controller ASIC (or ASICs), such as 102 of FIG. 1) can include an ASIC temperature monitor 631 that the controller can use to select which of the memory die to place into deep standby. The controller can also include NAND command sequencer 633 that, among other commands, can selectively issue either a regular standby command by de-asserting a memory chip's CE signal or issue a specific deep standby command to the memory device's memory circuits when setting the SSD into a standby mode. The controller can also include a power management module 635 for managing the operation of the PMIC 601. As noted, in some embodiments the PMIC functions can be a separate PMIC 601 and in other embodiments these can be part of a single controller ASIC.

All of the elements of FIG. 6 described above are in communication with the standby power saving algorithm 621. Based on the inputs from the other modules of FIG. 6, the power saving algorithm 621 can determine the operation of the PMIC 601 and the NAND command sequencer 633 for setting an SSD into a standby mode and selecting which memory circuits to place into (regular) standby and which to place in the deep standby mode based on characteristics of the individual memory dies and, in some embodiments, the temperature. The standby power saving algorithm 621, and also the NAND command sequencer 633 and power management module 635, can be variously implemented by the controller processors such 156 and the backend processors 220/250 through firmware. More generally, these functions can be implemented by various combinations of one or more of firmware, software, and hardware elements.

Figure 7:
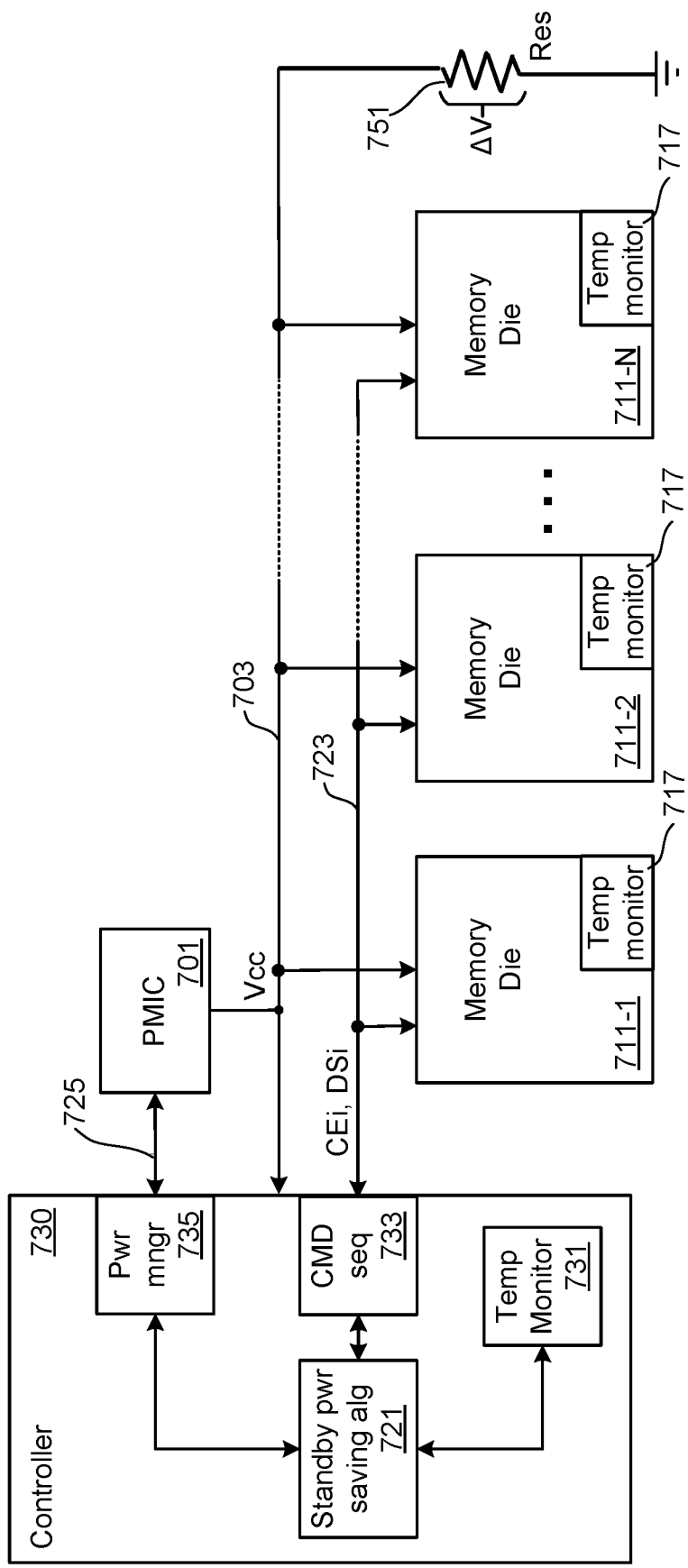
FIG. 7 is a simplified representation of the memory system of FIGS. 1-5 to illustrate an arrangement of the elements represented in FIG. 6.

FIG. 7 is a simplified representation of the memory system of FIGS. 1-5 to illustrate an arrangement of the elements represented in FIG. 6. FIG. 6 was a schematic representation of the interplay between the power modules, both hardware and firmware, of an SSD involved in standby operations. FIG. 7 illustrates an embodiment of how there different can be arranged on the components of an SSD, where, referring back to FIGS. 1-5, the controller ASIC (or ASICs) 730 can correspond the controller 102 and each of the memory dies 711-i can correspond memory die 300. FIG. 7 has been simplified to focus the main elements that enter into the following discussion.

In FIG. 7, a PMIC 701 is connected to a power supply line 703 supplying the level Vcc to a controller ASIC 730 and a number of memory chips 711-i. A memory system will often have several different supply levels, but for this discussion only a basic supply level Vcc is shown. The embodiment also represents a single controller ASIC 730 and a separate PMIC 701, but other embodiments may have several controller ASICs and the PMIC functions may be incorporated into the one or more controller ASICs. Of the shown elements, the memory die temperature monitors 717 can correspond to the temperature sensor 317. The temperature monitor 731 can be formed on a controller ASIC of controller 102 and the other modules on the controller 730 (command sequencer 733, power management module 735, and the standby power saving algorithm 721) can be variously implemented by the front end and back end elements of controller 102, including the processors 220/250 and 156.

Each of the memory die 711-i includes a temperature monitor 717, as does the controller ASIC at 631. The controller ASIC 730 also includes the NAND command sequencer 733, which can issue the CEi and deep standby (DSi) commands to the corresponding chips 711-i over command lines 723, and the power management module 735, that can communicate with PMIC 701 over line 725. The standby power saving algorithms running on the controller ASIC in firmware are represented at 721.

FIG. 7 also illustrates a resistor Res 751 connected between the power rail 703 and ground, with a voltage drop ΔV across Res 751. The use of this element will be discussed below with respect to FIG. 11.

Figure 8:
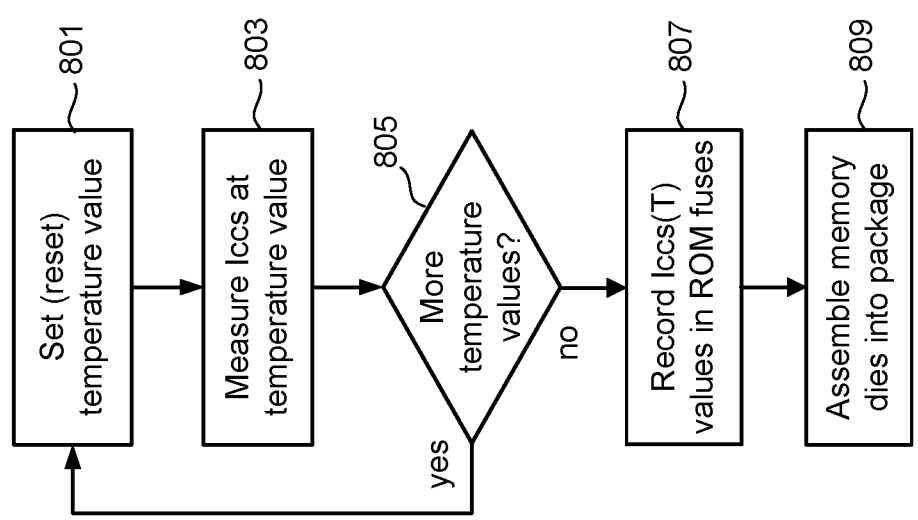
FIG. 8 is a flowchart describing one embodiment of a process for the monitoring and recording into a memory die's ROM of the standby current (Iccs) at the die sort or memory test level.

For an SSD to implement the standby power saving algorithm, the SSD will either know or monitor the Iccs of each of the memory chips. This can be implemented by determining the Iccs of the individual memory chips at the die sort or memory test level, or by having the SSD determine the Iccs levels of the memory chips. FIG. 8 illustrates an embodiment for the first of these options.

FIG. 8 is a flowchart describing one embodiment of a process for the monitoring and recording into a memory die's ROM of the (regular) standby current Iccs at the die sort or memory test level. The embodiment of FIG. 8 includes measuring of Iccs of a memory die at more than one temperature. Beginning at step 801, a temperature value is set for the memory die being characterized. The memory die is then set in a (normal) standby mode and the current drawn by the device is measured at step 803. For example, the memory die can be connected a power supply to receive a voltage level corresponding to what it would see in a typical application and have its chip enable signal CE de-asserted, corresponding to being in the (regular) standby state. Measuring the current drawn then give the standby current at the temperature value T of step 801, Iccs(T). Step 805 is a determination of whether Iccs is to be measured at more temperature values: if so, the flow loops back to step 801, resets the temperature at 801 and repeats step 803; if not, the flow moves on to step 807.

The number of different temperature values for which Iccs is measured depends on the embodiment. In some embodiment, only a single Iccs value is determined. In other embodiments, values can be measured for two or more temperatures. The standby power saving algorithm can use temperature values from the temperature monitors 717 on the memory die, from the ASIC temperature monitor 731, or both of these, to obtain a value for the temperature on the memory dies. Based on this determined temperature, the standby power saving algorithm can use the Iccs values at different temperatures from step 803 to determine an Iccs value at the measure temperature. For example, the Iccs at the temperature (from step 801) closest to the measure temperature could be used or the algorithm could extrapolate based on measured values. In one embodiment, Iccs could be measured for two temperatures at step 803 and a linear interpolation/extrapolation could be used determine an Iccs value for the temperature value provided by the temperature monitors.

Once the Iccs value or values have been determined, these can be recorded in ROM on the memory device, such as by setting fuse values in ROM 315 of FIG. 5, at step 807. For example, for bins of every 10 uA, the memory dies can store the Iccs values in ROM in terms of a code from 00h to Fh, corresponding to ICCS from 0-10 uA, 10-20 uA, etc., until 290-300 uA. These values can be downloaded into the SSD's file system at the production of the SSD or at firmware download. At step 809, the memory die can be assembled with other memory dies into an SSD.

If the Iccs values for the memory dies are known, this can be used in the selection of the memory die for the assembly of an SSD. As mentioned above, the Iccs values determined for the memory dies can allow them to be grouped into different bins, as illustrated in FIG. 9.

Figure 9:
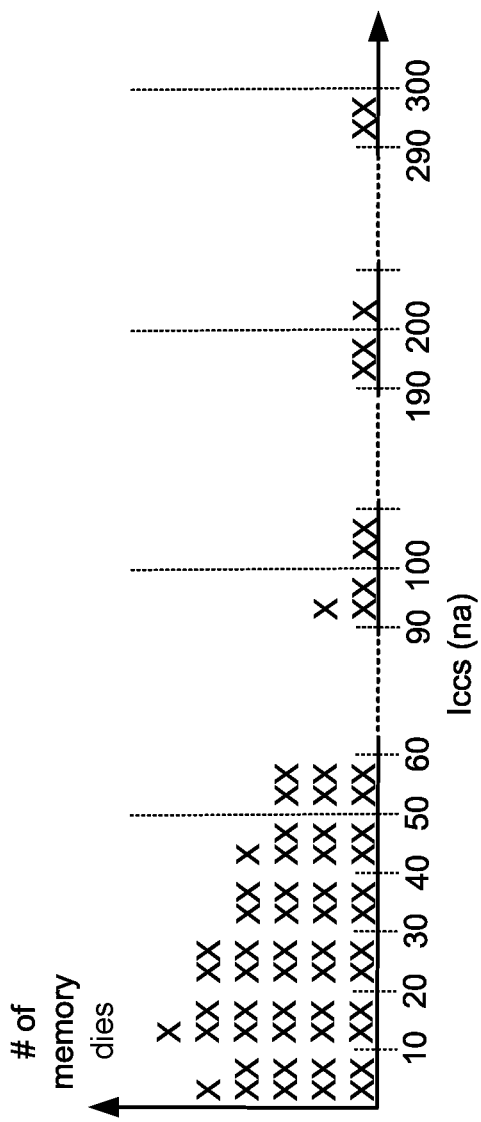
FIG. 9 illustrates the binning of memory die based on their standby current values.

FIG. 9 illustrates the binning of memory die based on their standby current Iccs values. The example of FIG. 9 uses Iccs bins with a width of 10 nanoamps, with some number of memory dies (indicated by the Xs) in each of the bins. In some applications, an SSD may be expected to not exceed a maximum current consumption when in standby, so that there is a collective Iccs budget for the memory dies of the SSD. The knowledge of the individual Iccs for each die can be used to obtain a higher yield, which can be made higher still if a deep standby mode is used.

For example, if an SSD can have a combined Iccs of 1000 na and has 20 memory die, this works out to an average Iccs per die of 50 na. Referring to the binning in FIG. 9, if all of the memory die selected for an SSD need to not exceed this average, a fairly large proportion of the memory die might not be usable, lowering device yield. If the individual Iccs values are known, though, the memory die can be selected such that the higher Iccs devices have their contribution offset by lower Iccs devices extending the acceptable Iccs value to, say, 100 na. If the standby power saving algorithm is used and the deep standby mode is available, the high Iccs can be placed in this deep standby mode to reduce their (deep) standby current to lower the collective Iccs value, allowing for use of memory die of even higher Iccs values that would otherwise exceed the combined Iccs. In this way, memory die with a (regular) standby current of, say, Iccs=200 na could be used while staying within budget, relaxing the Iccs of the individual die and further increasing yield.

Figure 10:
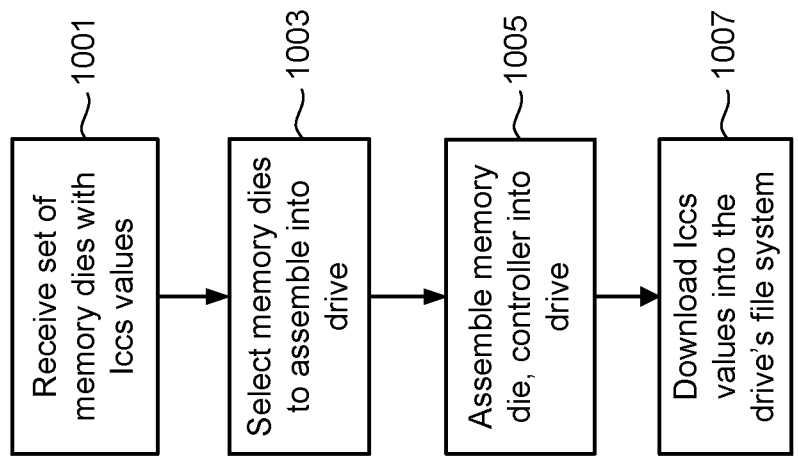
FIG. 10 is a flowchart describing one embodiment of a process of assembling a set of memory die into an SSD that incorporate knowledge of the Iccs values of the individual memory dies.

FIG. 10 is a flowchart describing one embodiment of a process of assembling a set of memory die into an SSD that incorporates knowledge of the Iccs values of the individual memory die. Beginning at step 1001, a set of memory die are received, along with each memory die's specified Iccs value or, if temperature dependence is included, set of Iccs values for different temperature values. A set of memory die are selected based upon their Iccs values at step 1003 so that, when one or more of the memory die are placed into a deep standby mode, the combined set of memory die meet the allocated combined Iccs budget for the set of memory die. At step 1005, the selected set of memory die are assembled into an SSD, along with the controller elements such as a controller ASIC and PMIC. Once assembled, the Iccs values for the selected set of memory die can be downloaded at step 1007 into the SSD's file system, either at the time of production of the SSD or at firmware download.

As noted above, for an SSD to implement the standby power saving algorithm, the SSD will either know or monitor the Iccs of each of the memory chips, where this can be implemented by determining the Iccs of the individual memory chips at the die sort or memory test level, or by having the SSD determine the Iccs levels of the memory chips. FIG. 8 illustrated an embodiment for the first of these options and FIG. 11 illustrate an embodiment for the second.

Figure 11:
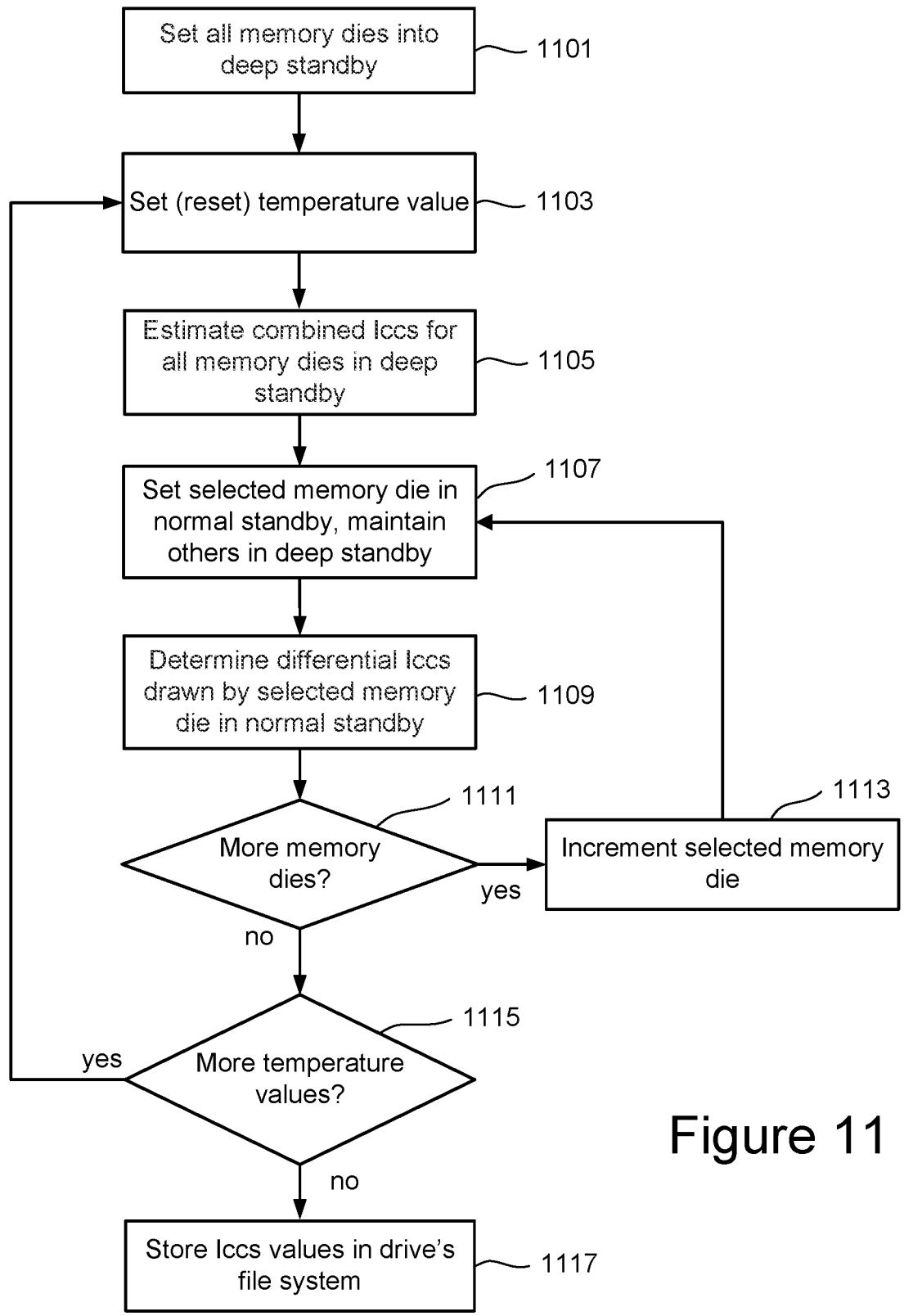
FIG. 11 is a flowchart describing one embodiment of a process for having an SSD individually determine the Iccs levels of its constituent memory dies.

FIG. 11 is a flowchart describing one embodiment of a process for having an SSD individually determine the Iccs levels of its constituent memory chip, allowing the SSD to identify the dies with the highest Iccs values. Starting at step 1101, the SSD sets all of the memory dies into deep standby mode. If the Iccs values are to be determined at more than one temperature, the first temperature is set at step 1103 and an estimate of the combined current pulled by all of the memory die of the SSD is determined at step 1105.

Step 1105 will provide a baseline Iccs for when all of the memory dies are in deep standby mode and reduce the combined Iccs of the memory by, for example, around 30% relative to the normal standby mode in a typical SSD. The PMIC 701 can estimate the composite ICCS of all the NAND dies, all of which share the same VCC supply on the memory package by using Iccs_a=ΔV/Res, where the Res 751 of FIG. 7 is a fixed size resistors in the power supply rail 703 to the NAND package that can only be turned on during the drive standby mode. The ΔV is the voltage difference between the two nodes of the resistor Res 751. The PMIC 701 can include a voltage comparator and be able to perform a digital-to-analog conversion to measure the Iccs_a value.

The Iccs of the individual memory die for the temperature value of step 1103 relative to the baseline value from step 1105 can then be determined. The Iccs of the individual memory dies, starting with die 0, is determined. At step 1107 all of the memory die except the selected die are maintained in the deep standby mode, with the selected memory die placed into the usual standby mode by the SSD. The PMIC 701 can then estimate the combined Iccs of all of the memory die, where the selected memory die is in the normal standby mode while all of the other memory dies are in deep standby at step 1109 by using Iccs_b=ΔV/Res. The value of the selected memory die is then (Iccs_b−Iccs_a)/(ΔIccs_total), where ΔIccs total is the difference between the combined total Iccs values of the all of the memory die in normal standby minus the combined total Iccs values of the all of the memory die in deep standby. For example, if the total combined Iccs_a value as determined in deep standby at step 1105 is 30% less than the normal standby total combined Iccs, then ΔIccs_total would be 0.3.

The process is similarly repeated for the other memory dies and for any additional temperatures. At step 1111 it is determined if there are more memory dies whose Iccs at the temperature values is to be determined. If so, the flow loops back to step 1107 after incrementing the memory die value at 1113. If all of Iccs values have been determined for all of the memory die have been determined, at step 1111 the flow instead goes to step 1115 to determine if the Iccs values are to be computed for additional temperature values: if so, the flow loops back to step 1103, the temperature value is reset and the process of steps 1103-1113 are repeated; and, if not, the flow goes to step 1117. In alternate embodiments, the loop from step 1115 and the loop from step 1111 can be interchanged, with the differing temperature values for a given memory die being determined first, then the different memory dies being looped through. For either order, once all of the Iccs values to be determined have been determined, they can be stored in the SSD's file system at step 1117.

Figure 12:
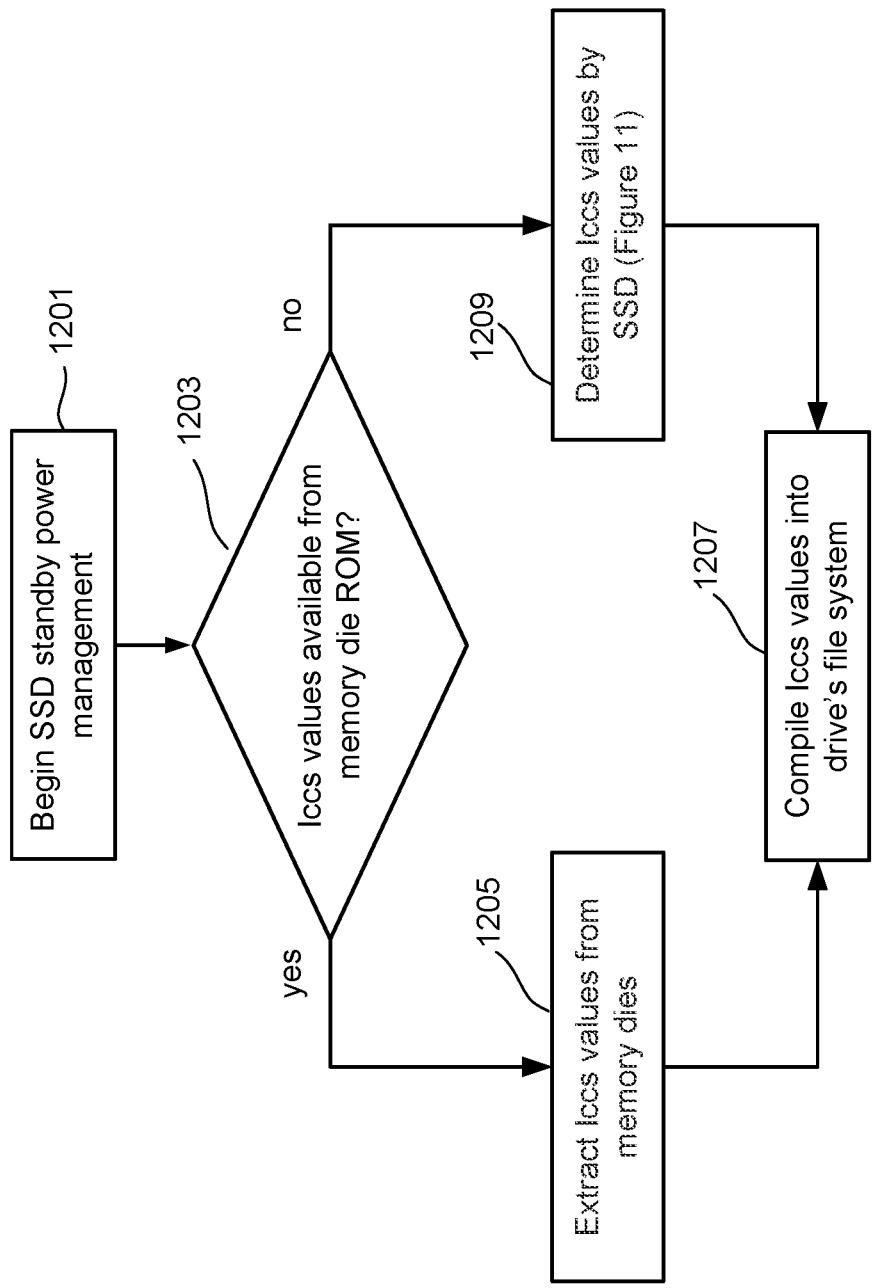
FIG. 12 is a flowchart describing one embodiment of a process for drive level standby power management using the Iccs values of the component memory dies.

FIG. 12 is a flowchart describing one embodiment of a process for drive level standby power management using the Iccs values of the component memory circuits. The SSD standby power management process starts at step 1201 by initiating the process on an assembled drive. At step 1203, the controller circuits on the SSD determines whether the Iccs values for the individual memory circuits are available from the memory devices themselves, such as described above with respect to FIG. 8 where the Iccs of each memory die was mapped and stored into the memory device's ROM at die sort or memory test. If the Iccs values are available, they are extracted from the memory die and downloaded by the controller circuits of the memory controller 730, PMIC 701, or both, at step 1205. The Iccs values can then be compiled into the file system for the SSD's usage at 1207.

If the Iccs values for the individual memory die are not available at step 1203, at step 1209 the SSD can perform this operation at drive test, such as described above with respect to the embodiment of FIG. 11. Once the SSD has determined the Iccs values of constituent memory dies, these can then be compiled into the drive's file system for the SSD usage at 1207. Once the Iccs values are in the file system at step 1207, either by way of step 1205, 1209, or other method, they can be used during the operation of the SSD, such as described in the embodiments of FIGS. 13 and 14.

Once the memory dies' Iccs values are known, during the power standby mode of the SSD the firmware of the standby power saving algorithm can issue the deep standby mode command to the NAND dies which have ICCS higher than a given threshold. This can be a combined threshold value for all of the memory die of the SSD or a chip by chip threshold. This threshold can be a function of temperature and can change over temperature for some embodiments, so a temperature measurement can be uses as well for accurate control. In some embodiments, the system can use additional factors to determine the threshold, such as the amount of cycling the drive has undergone as the Iccs value may change as the device ages, where this information could be determined by repeating the process of FIG. 11 at intervals (e.g., every 10 k cycles). For those memory die whose regular standby current Iccs is low, or differs little from its deep standby value, there is very little relative advantage to setting these devices into deep standby and they can set in the regular standby mode based on the memory device's chip enable signal being de-asserted.

Figure 13:
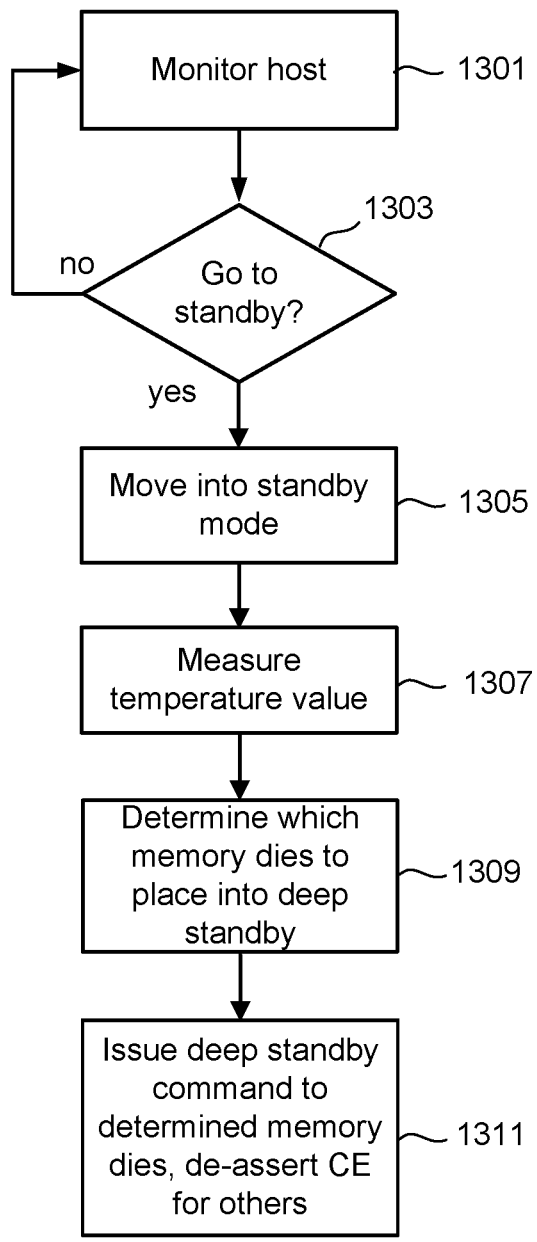
FIG. 13 is a flowchart describing one embodiment of a process for placing the memory system into a deep standby mode.

FIG. 13 is a flowchart describing one embodiment of a process for placing the SSD or other memory system into a deep standby mode. At step 1301 the SSD monitors host activity, deciding at step 1303 whether or not to move into standby mode. For example, if the drive has not received any commands from the host to access its memory die for some period, the SSD's controller circuits could set the drive into standby. If the determination is made not to go into standby, such as if the drive has been recently accessed by the host, the flow loops back to step 1301 and continues to monitor host activity. If the determination is made to go into standby at step 1303, the flow moved to step 1305. In some embodiments, the host can explicitly indicate that a drive can be set into standby.

At step 1305 the drive initiates the move into the standby mode, including setting selected ones of its memory dies into a deep standby. For embodiment that incorporate temperature dependence, at step 1307 measures the drive temperature. If the dependence of Iccs values on other parameters, such as device aging for example, these (e.g., number of program/erase cycles) are also determined at step 1307.

At step 1309 the system determines what threshold should be used as the threshold for which die to set into a deep standby mode based on the Iccs values of the memory dies. The threshold can be on a memory die by memory die basis, where all memory die having an Iccs above the threshold will set into deep standby, or based on the collective Iccs value for drive's memory die, where, for example, the memory die will be set into a deep standby by starting with the highest Iccs memory die and working down until enough memory dies are selected in order for the cumulative Iccs values to meet the total Iccs threshold. In some embodiment, if a memory die is currently performing background activities (such as garbage collection) requested by the controller, the issuance of a deep standby command may be delayed until the operations are completed.

At step 1311 the memory dies are placed into the standby mode. For memory die with relatively low Iccs values and where there would be little gain by going into a deep standby mode, these memory die can be placed into the (regular) standby mode by having their chip enable (CE) signals de-asserted if the corresponding CE signal is currently asserted. For the memory die selected at step 1309, these devices will be issued the deep standby command by the command sequencer 733. Based on the CE values and the selectively issued deep standby commands, the drive will then be in standby.

Figure 14:
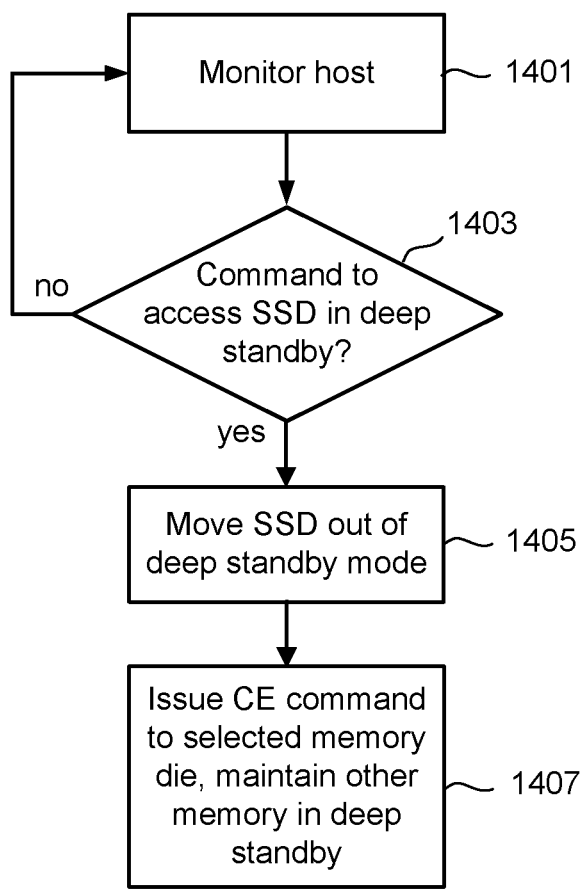
FIG. 14 is a flowchart describing one embodiment of a process to selectively bring the memory dies of the memory system out of a deep standby mode.

FIG. 14 is a flowchart describing one embodiment of a process to selectively bring the memory dies of the SSD or other memory system out of a deep standby mode. When the drive comes out of the standby mode, in some embodiments only the selected memory dies will need to come out of deep standby mode, instead of all the memory dies. At step 1401 the drive monitors host activity and, at step 1403, determines whether to come out of standby. This can be in response to a command from a host to access data that is on a memory die of the drive or, in some embodiments, in response to specific request to come out of standby mode. If there is no host activity that would cause the host to come out of standby, the flow loops back to step 1401. If the drive determine that it should come out of standby, the flow moves on to step 1405.

At step 1405 the system moves out of standby mode. Once the drive system is out of standby, any of the system's memory die that have been placed into the deep standby mode can continue to be maintained in the deep standby mode if they do not currently need to be accessed. The memory dies in deep standby mode can then be selectively taken out of deep standby when they are to be accessed. Depending the embodiment, a memory die in deep standby can be placed out of deep stand by receiving the corresponding chip enable signals or a specific command to come back. Commands to the individual die to come out of deep standby are issued by the command sequencer 733 at step 1407.

The techniques described above allow for an SSD or other multi-die system to dynamically adjust the standby power based on temperature. The embodiments provide for automatic standby power management at the system level with self-learning and efficiency improvements for the individual memory dies used in the SSD. It also allows use memory dies that may have higher Iccs values, so that memory die yield can be improved as well as relax Iccs values during die sort.

One embodiment includes an apparatus including a plurality of non-volatile memory dies and one or more control circuits connected to the plurality of memory dies. Each of the memory dies is configured to be operable in a first standby mode and in a second standby mode, where the memory die draws a lower amount of current when operating the second standby mode than when operating in the first standby mode. The one or more control circuits configured to maintain for each of the memory dies a corresponding value for current drawn when operating in the first standby mode, and place the apparatus into a standby mode by setting one or more selected ones of the memory dies into the second standby mode, the selected memory dies being selected based upon the corresponding value of the current drawn when operating in the first standby mode, and setting the others of the memory dies into the first standby mode.

One embodiment includes a method of setting a memory system including a plurality memory dies into a standby mode, each of the memory dies having a first standby mode and a second standby mode that consumes current at a lower rate than the first standby mode. Setting the memory system in standby mode includes: maintaining, for each the memory dies, a value for an amount of current drawn when in the first standby mode; comparing the value of the amount of current drawn current drawn by each of memory dies when in the first standby mode against a threshold value; based on the comparing, selecting one or more of the memory dies to place in the second standby mode; and setting the selected memory dies into the second standby mode and setting the others of the memory dies into the first standby mode.

One embodiment includes a solid state device that includes a plurality of memory dies and a controller. Each of the memory dies is operable in a low power standby mode and in a regular standby mode, where each of the memory dies consumes more current in the regular standby mode than in the low power standby mode. The controller is connected to the plurality of memory dies and configured to: concurrently set the plurality of memory dies into the low power standby mode; determine a first current level corresponding to a combined amount of current consumed by the plurality of memory dies when concurrently set in the low power standby mode; for each of a selected one or more of the memory dies, determine a corresponding second current level corresponding to a combined amount of current consumed by the plurality of memory dies with the selected memory die set in the regular standby mode and the others of the plurality of memory dies concurrently set in the low power standby mode; and for each of the selected one or more of the memory dies, determining a corresponding differential current level from a difference of the first current level and the corresponding second current level.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a plurality of non-volatile memory dies, wherein each of the memory dies is configured to be operable in:
      an active mode, in which the memory die is configured to execute commands received from a host, and
      a plurality of standby modes, in which the memory die does not execute commands received from a host, the plurality of standby modes including:
         a first standby mode, in which the memory die is configured to execute background operations, and
         a second standby mode, in which the memory die does not execute background operations and where each of the memory dies draws a lower amount of current when operating in the second standby mode than when operating in the first standby mode; and
   one or more control circuits connected to the plurality of memory dies, the one or more control circuits configured to:
      maintain, for each of the memory dies, a corresponding value for current drawn when operating in the first standby mode;
      select one or more of the memory dies to place into the second standby mode based upon the corresponding value of the current drawn when operating in the first standby mode; and
      place the apparatus into a standby mode by setting the one or more selected memory dies into the second standby mode and setting others of the memory dies into the first standby mode.

2. The apparatus of claim 1, wherein:
   each of the memory dies comprises a ROM memory storing the corresponding value for the current drawn when operating in the first standby mode, and
   wherein the one or more control circuits are further configured to:
      read, from each of the memory dies, the corresponding value for the current drawn when operating in the first standby mode.

3. The apparatus of claim 1, wherein the one or more control circuits are further configured to:
   determine, from each of the memory dies, the corresponding value for the current drawn when operating in the first standby mode.

4. The apparatus of claim 3, wherein the one or more control circuits are further configured to:
   concurrently place each of the memory dies into the second standby mode;
   with each of the plurality of memory dies concurrently placed into the second standby mode, determine a collective current drawn by the plurality of memory dies; and
   for each of the memory dies, determine the corresponding value for the current drawn when operating in the first standby mode by determining a difference between the collective current and a corresponding differential current, the differential current being a current drawn by the plurality of memory dies with the memory dies in the first standby mode concurrently with the others of the memory dies in the second standby mode.

5. The apparatus of claim 1, further comprising:
   one or more temperature monitors each configured to provide a temperature value to the control circuits,
   wherein the one or more control circuits are further configured to:
      maintain, for each of the memory dies, a corresponding plurality of values for current drawn when operating in the first standby mode where each of the corresponding plurality of values corresponds to a different temperature; and
      determine, based upon a first temperature value received from the one or more temperature values, a corresponding value of the current drawn for each of the memory dies when operating in the first standby mode at the first temperature value,
      wherein the selected memory dies are selected based upon the corresponding value of the current drawn when operating in the first standby mode at the first temperature value.

6. The apparatus of claim 5, wherein the one or more temperature monitors include a temperature monitor formed on the one or more control circuits.

7. The apparatus of claim 5, wherein the one or more temperature monitors include a temperature monitor formed on each of the memory dies.

8. The apparatus of claim 1, wherein the one or more control circuits are further configured to:
   set a specified memory die into the first standby mode by de-asserting a chip enable signal for the specified memory die; and
   set a specified memory die into the second standby mode by a command specific to entering the second standby mode.

9. The apparatus of claim 1, wherein the one or more control circuits are further configured to:
   monitor interactions with a host to which the apparatus is connected; and place the apparatus into the standby mode based the monitoring of the interactions with the host.

10. The apparatus of claim 1, wherein the one or more control circuits are further configured to:
place the apparatus into the standby mode in response to a command received from a host to which the apparatus is connected.

11. The apparatus of claim 1, wherein the one or more control circuits are further configured to:
take the apparatus out of the standby mode in response to a command received from a host to which the apparatus is connected, wherein each of the memory dies placed into the second standby mode is maintained in the second standby mode unless the command is for access thereof.

12. The apparatus of claim 11, wherein each of the memory dies placed into the second standby mode is maintained in the second standby mode unless receiving a chip enable signal.

13. A method, comprising:
setting a memory system including a plurality of memory dies into a standby mode, each of the memory dies having an active mode in which the memory die is configured to execute commands received from a host and a plurality of standby modes in which the memory die does not execute commands received from a host, the plurality of standby modes including a first standby mode in which the memory die is configured to execute background operations and a second standby mode in which the memory die does not execute background operations and consumes current at a lower rate than when in the first standby mode, setting the memory system into the standby mode comprising:
maintaining, for each of the memory dies, a value for an amount of current drawn when in the first standby mode;
comparing the value of the amount of current drawn by each of the memory dies when in the first standby mode against a threshold value;
based on the comparing, selecting one or more of the memory dies to place in the second standby mode; and
setting the selected memory dies into the second standby mode and setting others of the memory dies into the first standby mode.

14. The method of claim 13, further comprising:
subsequent to setting the memory system into the standby mode, receiving a command to access a first of the memory dies set into the second standby mode; and
in response to the command, taking the first memory die out of the second standby mode while maintaining in the second standby mode others of the memory dies set into the second standby mode.

15. The method of claim 13, wherein:
comparing the amount of current drawn by each of the memory dies when in the first standby mode against a threshold value comprises individually comparing the amount of current drawn by each of the memory dies when in the first standby mode against the threshold value.

16. The method of claim 13, further comprising:
determining, for each of the memory dies, the value for the amount of current drawn when in the first standby mode.

17. The method of claim 13, further comprising:
monitoring, by the memory system of a host device connected to the memory system, the memory system setting itself into the standby mode in response to the monitoring.

18. The method of claim 13, wherein setting the memory system into the standby mode further comprises:
maintaining, for each of the memory dies, a plurality of values for an amount of current drawn when in the first standby mode, wherein each of the plurality of values for each of the memory dies corresponds to an amount of current drawn when in the first standby mode at one of a corresponding plurality of temperatures;
receiving a temperature value; and
determining, for each of the memory dies, a value for an amount of current drawn at the received temperature value when in the first standby mode, and
wherein the comparing of the value of the amount of current drawn by each of the memory dies when in the first standby mode against a threshold value uses a threshold value corresponding to the amount of current drawn at the received temperature value.

19. A solid state device, comprising:
a plurality of memory dies each operable in:
an active mode, in which the memory die is configured to execute commands received from a host, and
a plurality of standby modes, in which the memory die does not execute commands received from a host, the plurality of standby modes including:
a low power standby mode in which the memory die does not execute background operations, and
a regular standby mode in which the memory die is configured to execute background operations, where each of the memory dies consumes more current in the regular standby mode than in the low power standby mode; and
a controller connected to the plurality of memory dies, the controller configured to:
concurrently set the plurality of memory dies into the low power standby mode;
determine a first current level corresponding to a combined amount of current consumed by the plurality of memory dies when concurrently set in the low power standby mode;
for each of a selected one or more of the memory dies, determine a corresponding second current level corresponding to a combined amount of current consumed by the plurality of memory dies with the selected memory die set in the regular standby mode and others of the plurality of memory dies concurrently set in the low power standby mode; and
for each of the selected one or more of the memory dies, determine a corresponding differential current level from a difference of the first current level and the corresponding second current level.

20. The solid state device of claim 19, further comprising:
a temperature sensor,
wherein the controller is further configured to:
receive temperature values from the temperature sensor; and
determine the first current level, each of the one or more second current levels, and each of the one or more differential current levels for each of a plurality of temperature values.

* * * * *